US009585281B2

(12) United States Patent
Schnell et al.

(10) Patent No.: US 9,585,281 B2
(45) Date of Patent: Feb. 28, 2017

(54) SYSTEM AND METHOD FOR FLEXIBLE STORAGE AND NETWORKING PROVISIONING IN LARGE SCALABLE PROCESSOR INSTALLATIONS

(71) Applicant: III Holdings 2, LLC, Wilmington, DE (US)

(72) Inventors: Arnold Thomas Schnell, Pflugerville, TX (US); Richard Owen Waldorf, Austin, TX (US); David Borland, Austin, TX (US)

(73) Assignee: III HOLDINGS 2, LLC, Wilmington, DE (US)

( * ) Notice: Subject to any disclaimer, the term of this patent is extended or adjusted under 35 U.S.C. 154(b) by 350 days.

(21) Appl. No.: 14/106,697

(22) Filed: Dec. 13, 2013

(65) Prior Publication Data

US 2014/0101932 A1  Apr. 17, 2014

Related U.S. Application Data

(62) Division of application No. 13/284,855, filed on Oct. 28, 2011, now abandoned.

(51) Int. Cl.
*H05K 7/14* (2006.01)
*G06F 1/18* (2006.01)

(52) U.S. Cl.
CPC ......... *H05K 7/1485* (2013.01); *G06F 1/189* (2013.01); *H05K 7/1498* (2013.01); *Y10T 29/49002* (2015.01); *Y10T 29/49117* (2015.01)

(58) Field of Classification Search
CPC ... H05K 7/20; H05K 5/00; H01R 9/05; G06F 1/16; G06F 1/20

USPC .......... 361/679.01, 679.02, 679.21, 679.32, 361/679.4, 679.41, 679.6, 724–727, 730, 361/735; 312/223.1–223.3; 174/15.1; 165/80.4, 104.33

See application file for complete search history.

(56) References Cited

U.S. PATENT DOCUMENTS

| | | | |
|---|---|---|---|
| 5,451,936 A | 9/1995 | Yang et al. | |
| 5,594,908 A | 1/1997 | Hyatt | |
| 5,623,641 A | 4/1997 | Kadoyashiki | |
| 5,781,187 A | 7/1998 | Gephardt et al. | |
| 5,901,048 A | 5/1999 | Hu | |
| 5,908,468 A | 6/1999 | Hartmann | |
| 5,968,176 A | 10/1999 | Nessett et al. | |
| 5,971,804 A * | 10/1999 | Gallagher et al. | 439/581 |
| 6,055,618 A | 4/2000 | Thorson | |

(Continued)

FOREIGN PATENT DOCUMENTS

| | | |
|---|---|---|
| JP | 2005-223753 | 8/2005 |
| JP | 2005-536960 | 12/2005 |

(Continued)

OTHER PUBLICATIONS

PCT Search Report and Written Opinion mailed on Mar. 1, 2013 corresponding to the related PCT Patent Application No. US12/61747.

(Continued)

*Primary Examiner* — Courtney Smith
*Assistant Examiner* — Zhengfu Feng

(57) ABSTRACT

A system and method for provisioning within a system design to allow the storage and IO resources to scale with compute resources are provided.

17 Claims, 14 Drawing Sheets

(56) References Cited

U.S. PATENT DOCUMENTS

| | | |
|---|---|---|
| 6,141,214 A | 10/2000 | Ahn |
| 6,181,699 B1 | 1/2001 | Crinion et al. |
| 6,192,414 B1 | 2/2001 | Horn |
| 6,198,741 B1 | 3/2001 | Yoshizawa et al. |
| 6,314,487 B1 | 11/2001 | Hahn et al. |
| 6,314,501 B1 | 11/2001 | Gulick et al. |
| 6,373,841 B1 | 4/2002 | Goh et al. |
| 6,442,137 B1 | 8/2002 | Yu et al. |
| 6,446,192 B1 | 9/2002 | Narasimhan et al. |
| 6,452,809 B1 | 9/2002 | Jackson et al. |
| 6,507,586 B1 | 1/2003 | Satran et al. |
| 6,556,952 B1 | 4/2003 | Magro |
| 6,574,238 B1 | 6/2003 | Thrysoe |
| 6,711,691 B1 | 3/2004 | Howard et al. |
| 6,766,389 B2 | 7/2004 | Hayter et al. |
| 6,813,676 B1 | 11/2004 | Henry et al. |
| 6,816,750 B1 | 11/2004 | Klaas |
| 6,842,430 B1 | 1/2005 | Melnik |
| 6,857,026 B1 | 2/2005 | Cain |
| 6,963,926 B1 | 11/2005 | Robinson |
| 6,963,948 B1 | 11/2005 | Gulick |
| 6,977,939 B2 | 12/2005 | Joy et al. |
| 6,988,170 B2 | 1/2006 | Barroso et al. |
| 6,990,063 B1 | 1/2006 | Lenoski et al. |
| 7,020,695 B1 | 3/2006 | Kundu et al. |
| 7,032,119 B2 | 4/2006 | Fung |
| 7,080,078 B1 | 7/2006 | Slaughter et al. |
| 7,080,283 B1 | 7/2006 | Songer et al. |
| 7,095,738 B1 | 8/2006 | Desanti |
| 7,119,591 B1 | 10/2006 | Lin |
| 7,143,153 B1 | 11/2006 | Black et al. |
| 7,165,120 B1 | 1/2007 | Giles et al. |
| 7,170,315 B2 | 1/2007 | Bakker et al. |
| 7,180,866 B1 | 2/2007 | Chartre et al. |
| 7,203,063 B2 * | 4/2007 | Bash et al. ............ 361/699 |
| 7,257,655 B1 | 8/2007 | Burney et al. |
| 7,263,288 B1 | 8/2007 | Islam |
| 7,274,705 B2 | 9/2007 | Chang et al. |
| 7,278,582 B1 | 10/2007 | Siegel et al. |
| 7,310,319 B2 | 12/2007 | Awsienko et al. |
| 7,325,050 B2 | 1/2008 | O'Connor et al. |
| 7,337,333 B2 | 2/2008 | O'Conner et al. |
| 7,340,777 B1 | 3/2008 | Szor |
| 7,353,362 B2 | 4/2008 | Georgiou et al. |
| 7,382,154 B2 | 6/2008 | Ramos et al. |
| 7,386,888 B2 | 6/2008 | Liang et al. |
| 7,418,534 B2 | 8/2008 | Hayter et al. |
| 7,437,540 B2 | 10/2008 | Paolucci et al. |
| 7,447,147 B2 | 11/2008 | Nguyen et al. |
| 7,447,197 B2 | 11/2008 | Terrell et al. |
| 7,466,712 B2 | 12/2008 | Makishima et al. |
| 7,467,306 B2 | 12/2008 | Cartes et al. |
| 7,467,358 B2 | 12/2008 | Kang et al. |
| 7,502,884 B1 | 3/2009 | Shah et al. |
| 7,519,843 B1 | 4/2009 | Buterbaugh et al. |
| 7,555,666 B2 | 6/2009 | Brundridge et al. |
| 7,583,661 B2 | 9/2009 | Chaudhuri |
| 7,586,841 B2 | 9/2009 | Vasseur |
| 7,596,144 B2 | 9/2009 | Pong |
| 7,599,360 B2 | 10/2009 | Edsall et al. |
| 7,606,225 B2 | 10/2009 | Xie et al. |
| 7,606,245 B2 | 10/2009 | Ma et al. |
| 7,616,646 B1 | 11/2009 | Ma et al. |
| 7,620,057 B1 | 11/2009 | Aloni et al. |
| 7,644,215 B2 | 1/2010 | Wallace et al. |
| 7,657,677 B2 | 2/2010 | Huang et al. |
| 7,657,756 B2 | 2/2010 | Hall |
| 7,660,922 B2 | 2/2010 | Harriman |
| 7,664,110 B1 | 2/2010 | Lovett et al. |
| 7,673,164 B1 | 3/2010 | Agarwal |
| 7,710,936 B2 | 5/2010 | Morales Barroso |
| 7,719,834 B2 * | 5/2010 | Miyamoto et al. ........ 361/695 |
| 7,721,125 B2 | 5/2010 | Fung |
| 7,751,433 B2 | 7/2010 | Dollo et al. |
| 7,760,720 B2 | 7/2010 | Pullela et al. |
| 7,761,687 B2 | 7/2010 | Blumrich et al. |
| 7,783,910 B2 | 8/2010 | Felter et al. |
| 7,791,894 B2 | 9/2010 | Bechtolsheim |
| 7,792,113 B1 | 9/2010 | Foschiano et al. |
| 7,796,399 B2 | 9/2010 | Clayton et al. |
| 7,801,132 B2 | 9/2010 | Ofek et al. |
| 7,802,017 B2 | 9/2010 | Uemura et al. |
| 7,805,575 B1 | 9/2010 | Agarwal et al. |
| 7,831,839 B2 | 11/2010 | Hatakeyama |
| 7,840,703 B2 | 11/2010 | Arimilli et al. |
| 7,865,614 B2 | 1/2011 | Lu et al. |
| 7,925,795 B2 | 4/2011 | Tamir et al. |
| 7,934,005 B2 | 4/2011 | Fascenda |
| 7,970,929 B1 | 6/2011 | Mahalingaiah |
| 7,975,110 B1 | 7/2011 | Spaur et al. |
| 7,991,817 B2 | 8/2011 | Dehon et al. |
| 7,991,922 B2 | 8/2011 | Hayter et al. |
| 7,992,151 B2 | 8/2011 | Warrier et al. |
| 8,019,832 B2 | 9/2011 | De Sousa et al. |
| 8,060,760 B2 | 11/2011 | Shetty et al. |
| 8,060,775 B1 | 11/2011 | Sharma et al. |
| 8,082,400 B1 | 12/2011 | Chang et al. |
| 8,108,508 B1 | 1/2012 | Goh et al. |
| 8,122,269 B2 | 2/2012 | Houlihan et al. |
| 8,132,034 B2 | 3/2012 | Lambert et al. |
| 8,155,113 B1 | 4/2012 | Agarwal |
| 8,156,362 B2 | 4/2012 | Branover et al. |
| 8,165,120 B2 | 4/2012 | Maruccia et al. |
| 8,170,040 B2 | 5/2012 | Konda |
| 8,180,996 B2 | 5/2012 | Fullerton et al. |
| 8,189,612 B2 | 5/2012 | Lemaire et al. |
| 8,194,659 B2 | 6/2012 | Ban |
| 8,199,636 B1 | 6/2012 | Rouyer et al. |
| 8,205,103 B2 | 6/2012 | Kazama et al. |
| 8,379,425 B2 | 2/2013 | Fukuoka et al. |
| 8,397,092 B2 | 3/2013 | Karnowski |
| 8,407,428 B2 | 3/2013 | Cheriton et al. |
| 8,504,791 B2 | 8/2013 | Cheriton et al. |
| RE44,610 E | 11/2013 | Krakirian et al. |
| 8,599,863 B2 | 12/2013 | Davis |
| 8,684,802 B1 | 4/2014 | Gross et al. |
| 8,738,860 B1 | 5/2014 | Griffin et al. |
| 8,745,275 B2 | 6/2014 | Ikeya et al. |
| 8,745,302 B2 | 6/2014 | Davis et al. |
| 8,782,321 B2 | 7/2014 | Harriman et al. |
| 8,812,400 B2 | 8/2014 | Faraboschi et al. |
| 8,824,485 B2 | 9/2014 | Biswas et al. |
| 8,854,831 B2 | 10/2014 | Arnouse |
| 8,903,964 B2 | 12/2014 | Breslin et al. |
| 9,008,079 B2 | 4/2015 | Davis et al. |
| 9,311,269 B2 | 4/2016 | Davis et al. |
| 2001/0046227 A1 | 11/2001 | Matsuhira et al. |
| 2002/0004912 A1 | 1/2002 | Fung |
| 2002/0040391 A1 | 4/2002 | Chaiken et al. |
| 2002/0083352 A1 | 6/2002 | Fujimoto et al. |
| 2002/0097732 A1 | 7/2002 | Worster et al. |
| 2002/0107903 A1 | 8/2002 | Richter et al. |
| 2002/0124128 A1 | 9/2002 | Qiu |
| 2002/0159452 A1 | 10/2002 | Foster et al. |
| 2002/0161917 A1 | 10/2002 | Shapiro et al. |
| 2002/0172205 A1 | 11/2002 | Tagore-Brage et al. |
| 2002/0186656 A1 | 12/2002 | Vu |
| 2002/0194412 A1 | 12/2002 | Bottom |
| 2003/0007493 A1 | 1/2003 | Oi et al. |
| 2003/0033547 A1 | 2/2003 | Larson et al. |
| 2003/0041266 A1 | 2/2003 | Ke et al. |
| 2003/0076832 A1 | 4/2003 | Ni |
| 2003/0093255 A1 | 5/2003 | Freyensee et al. |
| 2003/0093624 A1 | 5/2003 | Arimilli et al. |
| 2003/0110262 A1 | 6/2003 | Hasan et al. |
| 2003/0140190 A1 | 7/2003 | Mahony et al. |
| 2003/0158940 A1 | 8/2003 | Leigh |
| 2003/0159083 A1 | 8/2003 | Fukuhara et al. |
| 2003/0172191 A1 | 9/2003 | Williams |
| 2003/0188083 A1 | 10/2003 | Kumar et al. |
| 2003/0193402 A1 | 10/2003 | Post et al. |
| 2003/0202520 A1 | 10/2003 | Witkowski et al. |
| 2003/0231624 A1 | 12/2003 | Alappat et al. |
| 2004/0013113 A1 | 1/2004 | Singh et al. |

(56) References Cited

U.S. PATENT DOCUMENTS

| | | |
|---|---|---|
| 2004/0017806 A1 | 1/2004 | Yazdy et al. |
| 2004/0017808 A1 | 1/2004 | Forbes et al. |
| 2004/0030938 A1 | 2/2004 | Barr et al. |
| 2004/0068676 A1 | 4/2004 | Larson et al. |
| 2004/0111612 A1 | 6/2004 | Choi et al. |
| 2004/0141521 A1 | 7/2004 | George |
| 2004/0165588 A1 | 8/2004 | Pandya |
| 2004/0210693 A1 | 10/2004 | Zeitler et al. |
| 2004/0215864 A1 | 10/2004 | Arimilli et al. |
| 2004/0215991 A1 | 10/2004 | McAfee et al. |
| 2004/0267486 A1 | 12/2004 | Percer et al. |
| 2005/0015378 A1 | 1/2005 | Gammel et al. |
| 2005/0018604 A1 | 1/2005 | Dropps et al. |
| 2005/0018606 A1 | 1/2005 | Dropps et al. |
| 2005/0018663 A1 | 1/2005 | Dropps et al. |
| 2005/0021606 A1 | 1/2005 | Davies et al. |
| 2005/0030954 A1 | 2/2005 | Dropps et al. |
| 2005/0033742 A1 | 2/2005 | Kamvar et al. |
| 2005/0033890 A1 | 2/2005 | Lee |
| 2005/0044195 A1 | 2/2005 | Westfall |
| 2005/0077921 A1 | 4/2005 | Percer et al. |
| 2005/0105538 A1 | 5/2005 | Perera et al. |
| 2005/0141424 A1 | 6/2005 | Lim et al. |
| 2005/0228852 A1 | 10/2005 | Santos et al. |
| 2005/0240688 A1 | 10/2005 | Moerman et al. |
| 2006/0002311 A1 | 1/2006 | Iwanaga et al. |
| 2006/0013218 A1 | 1/2006 | Shore et al. |
| 2006/0029053 A1 | 2/2006 | Roberts et al. |
| 2006/0090025 A1 | 4/2006 | Tufford et al. |
| 2006/0136570 A1 | 6/2006 | Pandya |
| 2006/0140211 A1 | 6/2006 | Huang et al. |
| 2006/0174342 A1 | 8/2006 | Zaheer et al. |
| 2006/0179241 A1 | 8/2006 | Clark et al. |
| 2006/0236371 A1 | 10/2006 | Fish |
| 2006/0248359 A1 | 11/2006 | Fung |
| 2006/0259734 A1 | 11/2006 | Sheu et al. |
| 2006/0265609 A1 | 11/2006 | Fung |
| 2007/0006001 A1 | 1/2007 | Isobe et al. |
| 2007/0076653 A1 | 4/2007 | Park et al. |
| 2007/0094486 A1 | 4/2007 | Moore et al. |
| 2007/0109968 A1 | 5/2007 | Hussain et al. |
| 2007/0130397 A1 | 6/2007 | Tsu |
| 2007/0174390 A1 | 7/2007 | Silvain et al. |
| 2007/0180310 A1 | 8/2007 | Johnson et al. |
| 2007/0209072 A1 | 9/2007 | Chen |
| 2007/0226795 A1 | 9/2007 | Conti et al. |
| 2007/0280230 A1 | 12/2007 | Park |
| 2007/0286009 A1 | 12/2007 | Norman |
| 2007/0288585 A1 | 12/2007 | Sekiguchi et al. |
| 2008/0013453 A1 | 1/2008 | Chiang et al. |
| 2008/0040463 A1 | 2/2008 | Brown et al. |
| 2008/0052437 A1 | 2/2008 | Loffink et al. |
| 2008/0059782 A1 | 3/2008 | Kruse et al. |
| 2008/0075089 A1 | 3/2008 | Evans et al. |
| 2008/0089358 A1 | 4/2008 | Basso et al. |
| 2008/0104264 A1 | 5/2008 | Duerk et al. |
| 2008/0140771 A1 | 6/2008 | Vass et al. |
| 2008/0140930 A1 | 6/2008 | Hotchkiss |
| 2008/0159745 A1 | 7/2008 | Segal |
| 2008/0162691 A1 | 7/2008 | Zhang et al. |
| 2008/0183882 A1 | 7/2008 | Flynn et al. |
| 2008/0186965 A1 | 8/2008 | Zheng et al. |
| 2008/0199133 A1 | 8/2008 | Takizawa et al. |
| 2008/0212273 A1 | 9/2008 | Bechtolsheim |
| 2008/0212276 A1 | 9/2008 | Bottom et al. |
| 2008/0217021 A1 | 9/2008 | Lembcke et al. |
| 2008/0222434 A1 | 9/2008 | Shimizu et al. |
| 2008/0235443 A1 | 9/2008 | Chow et al. |
| 2008/0243634 A1 | 10/2008 | Dworkin et al. |
| 2008/0250181 A1 | 10/2008 | Li et al. |
| 2008/0259555 A1 | 10/2008 | Bechtolsheim et al. |
| 2008/0259788 A1 | 10/2008 | Wang et al. |
| 2008/0266793 A1 | 10/2008 | Lee |
| 2008/0270599 A1 | 10/2008 | Tamir et al. |
| 2008/0288660 A1 | 11/2008 | Balasubramanian et al. |
| 2008/0288664 A1 | 11/2008 | Pettey et al. |
| 2008/0288683 A1 | 11/2008 | Ramey |
| 2008/0301794 A1 | 12/2008 | Lee |
| 2008/0310848 A1 | 12/2008 | Yasuda et al. |
| 2008/0313369 A1 | 12/2008 | Verdoorn et al. |
| 2008/0320161 A1 | 12/2008 | Maruccia et al. |
| 2009/0021907 A1 | 1/2009 | Mann et al. |
| 2009/0044036 A1 | 2/2009 | Merkin |
| 2009/0063443 A1 | 3/2009 | Arimilli et al. |
| 2009/0064287 A1 | 3/2009 | Bagepalli et al. |
| 2009/0080428 A1 | 3/2009 | Witkowski et al. |
| 2009/0097200 A1 | 4/2009 | Sharma et al. |
| 2009/0113130 A1 | 4/2009 | He et al. |
| 2009/0133129 A1 | 5/2009 | Jeong et al. |
| 2009/0135751 A1 | 5/2009 | Hodges et al. |
| 2009/0135835 A1 | 5/2009 | Gallatin et al. |
| 2009/0158070 A1 | 6/2009 | Gruendler |
| 2009/0172423 A1 | 7/2009 | Song et al. |
| 2009/0198958 A1 | 8/2009 | Arimilli et al. |
| 2009/0204834 A1 | 8/2009 | Hendin et al. |
| 2009/0204837 A1 | 8/2009 | Raval et al. |
| 2009/0219827 A1 | 9/2009 | Chen et al. |
| 2009/0222884 A1 | 9/2009 | Shaji et al. |
| 2009/0225751 A1 | 9/2009 | Koenck et al. |
| 2009/0235104 A1 | 9/2009 | Fung |
| 2009/0248943 A1 | 10/2009 | Jiang et al. |
| 2009/0259863 A1 | 10/2009 | Williams et al. |
| 2009/0259864 A1 | 10/2009 | Li et al. |
| 2009/0265045 A1 | 10/2009 | Coxe, III |
| 2009/0271656 A1 | 10/2009 | Yokota et al. |
| 2009/0276666 A1 | 11/2009 | Haley et al. |
| 2009/0279518 A1 | 11/2009 | Falk et al. |
| 2009/0282274 A1 | 11/2009 | Langgood et al. |
| 2009/0282419 A1 | 11/2009 | Mejdrich et al. |
| 2009/0313390 A1 | 12/2009 | Ahuja et al. |
| 2010/0005331 A1 | 1/2010 | Somasundaram et al. |
| 2010/0008038 A1 | 1/2010 | Coglitore |
| 2010/0008365 A1 | 1/2010 | Porat |
| 2010/0026408 A1 | 2/2010 | Shau |
| 2010/0040053 A1* | 2/2010 | Gottumukkula et al. .... 370/357 |
| 2010/0049822 A1 | 2/2010 | Davies et al. |
| 2010/0051391 A1 | 3/2010 | Jahkonen |
| 2010/0106987 A1 | 4/2010 | Lambert et al. |
| 2010/0118880 A1 | 5/2010 | Kunz et al. |
| 2010/0125742 A1 | 5/2010 | Ohtani |
| 2010/0125915 A1 | 5/2010 | Hall et al. |
| 2010/0138481 A1 | 6/2010 | Behrens |
| 2010/0158005 A1 | 6/2010 | Mukhopadhyay et al. |
| 2010/0161909 A1 | 6/2010 | Nation et al. |
| 2010/0165983 A1 | 7/2010 | Aybay et al. |
| 2010/0169479 A1 | 7/2010 | Jeong et al. |
| 2010/0198972 A1 | 8/2010 | Umbehocker |
| 2010/0218194 A1 | 8/2010 | Dallman et al. |
| 2010/0220732 A1 | 9/2010 | Hussain et al. |
| 2010/0250914 A1 | 9/2010 | Abdul et al. |
| 2010/0265650 A1 | 10/2010 | Chen et al. |
| 2010/0281246 A1 | 11/2010 | Bristow et al. |
| 2010/0299548 A1 | 11/2010 | Chadirchi et al. |
| 2010/0308897 A1 | 12/2010 | Evoy et al. |
| 2010/0312910 A1 | 12/2010 | Lin et al. |
| 2010/0312969 A1 | 12/2010 | Yamazaki et al. |
| 2010/0318812 A1 | 12/2010 | Auradkar et al. |
| 2011/0023104 A1 | 1/2011 | Franklin |
| 2011/0026397 A1 | 2/2011 | Saltsidis et al. |
| 2011/0029652 A1 | 2/2011 | Chhuor et al. |
| 2011/0058573 A1 | 3/2011 | Balakavi et al. |
| 2011/0075369 A1 | 3/2011 | Sun et al. |
| 2011/0090633 A1 | 4/2011 | Rabinovitz |
| 2011/0103391 A1 | 5/2011 | Davis et al. |
| 2011/0113115 A1 | 5/2011 | Chang et al. |
| 2011/0119344 A1 | 5/2011 | Eustis |
| 2011/0123014 A1 | 5/2011 | Smith |
| 2011/0138046 A1 | 6/2011 | Bonnier et al. |
| 2011/0185370 A1 | 7/2011 | Tamir et al. |
| 2011/0191514 A1 | 8/2011 | Wu et al. |
| 2011/0191610 A1 | 8/2011 | Agarwal et al. |
| 2011/0197012 A1 | 8/2011 | Liao et al. |
| 2011/0210975 A1 | 9/2011 | Wong et al. |

(56) References Cited

U.S. PATENT DOCUMENTS

| | | | |
|---|---|---|---|
| 2011/0239014 A1* | 9/2011 | Karnowski | G06F 1/3209 713/320 |
| 2011/0271159 A1 | 11/2011 | Ahn et al. | |
| 2011/0273840 A1 | 11/2011 | Chen | |
| 2011/0295991 A1 | 12/2011 | Aida | |
| 2011/0296141 A1 | 12/2011 | Daffron | |
| 2011/0320690 A1 | 12/2011 | Petersen et al. | |
| 2012/0011500 A1 | 1/2012 | Faraboschi et al. | |
| 2012/0020207 A1 | 1/2012 | Corti et al. | |
| 2012/0050981 A1 | 3/2012 | Xu et al. | |
| 2012/0054469 A1 | 3/2012 | Ikeya et al. | |
| 2012/0054511 A1 | 3/2012 | Brinks et al. | |
| 2012/0081850 A1 | 4/2012 | Regimbal et al. | |
| 2012/0096211 A1 | 4/2012 | Davis et al. | |
| 2012/0099265 A1 | 4/2012 | Reber | |
| 2012/0131201 A1 | 5/2012 | Matthews et al. | |
| 2012/0155168 A1 | 6/2012 | Kim et al. | |
| 2012/0198252 A1 | 8/2012 | Kirschtein et al. | |
| 2012/0207165 A1 | 8/2012 | Davis | |
| 2012/0297042 A1 | 11/2012 | Davis et al. | |
| 2013/0010639 A1 | 1/2013 | Armstrong et al. | |
| 2013/0024645 A1 | 1/2013 | Cheriton et al. | |
| 2013/0031331 A1 | 1/2013 | Cheriton et al. | |
| 2013/0058250 A1 | 3/2013 | Casado et al. | |
| 2013/0094499 A1 | 4/2013 | Davis et al. | |
| 2013/0097448 A1 | 4/2013 | Davis et al. | |
| 2013/0111107 A1 | 5/2013 | Chang et al. | |
| 2013/0148667 A1 | 6/2013 | Hama et al. | |
| 2013/0163605 A1 | 6/2013 | Chandra et al. | |
| 2013/0290643 A1 | 10/2013 | Lim et al. | |
| 2013/0290650 A1 | 10/2013 | Chang et al. | |
| 2013/0318269 A1 | 11/2013 | Dalal et al. | |
| 2014/0122833 A1 | 5/2014 | Davis et al. | |
| 2014/0359044 A1 | 12/2014 | Davis et al. | |
| 2014/0365596 A1 | 12/2014 | Kanevsky et al. | |
| 2015/0039840 A1 | 2/2015 | Chandra et al. | |
| 2015/0103826 A1 | 4/2015 | Davis | |

FOREIGN PATENT DOCUMENTS

| | | |
|---|---|---|
| TW | M377621 | 4/2010 |
| TW | 201017430 | 5/2010 |
| WO | WO-2004/021641 | 3/2004 |
| WO | WO-2005/013143 | 2/2005 |
| WO | WO-2008/000193 | 1/2008 |
| WO | WO-2011/044271 | 4/2011 |
| WO | WO-2012/037494 | 3/2012 |

OTHER PUBLICATIONS

Elghany et al., "High Throughput High Performance NoC Switch," NORCHIP 2008, Nov. 2008, pp. 237-240.
Grecu et al., "A Scalable Communication-Centric SoC Interconnect Architecture" Proceedings 5th International Symposium on Quality Electronic Design, 2005, pp. 343, 348 (full article included).
Hossain et al., "Extended Butterfly Fat Tree Interconnection (EFTI) Architecture for Network on Chip," 2005 IEEE Pacific Rim Conference on Communicatinos, Computers and Signal Processing, Aug. 2005, pp. 613-616.
Non-Final Office Action on U.S. Appl. No. 14/106,698, mailed Feb. 12, 2015.
Non-Final Office Action on U.S. Appl. No. 14/334,931, mailed Jan. 5, 2015.
Pande et al., "Design of a Switch for Network on Chip Applications," May 25-28, 2003 Proceedings of the 2003 International Symposium on Circuits and Systems, vol. 5, pp. V217-V220.
Final Office Action on U.S. Appl. No. 13/692,741, mailed Mar. 11, 2015.
Notice of Allowance on U.S. Appl. No. 13/475,713, mailed Feb. 5, 2015.
Notice of Allowance on U.S. Appl. No. 13/475,722, mailed Feb. 27, 2015.
Notice of Allowance on U.S. Appl. No. 13/527,498, mailed Feb. 23, 2015.
Notice of Allowance on U.S. Appl. No. 13/527,505, mailed Mar. 6, 2015.
Notice of Allowance on U.S. Appl. No. 13/624,731, mailed Mar. 5, 2015.
Reexamination Report on Japanese Application 2012-536877, mailed Jan. 22, 2015 (English Translation not available).
Search Report on EP Application 10827330.1, mailed Feb. 12, 2015.
International Preliminary Report on Patentability for PCT/US2012/061747, mailed Apr. 29, 2014.
Non-Final Office Action on U.S. Appl. No. 13/284,855, mailed Dec. 19, 2013.
Notice of Allowance on U.S. Appl. No. 13/284,855, mailed Jul. 14, 2014.
Advanced Switching Technology Tech Brief, published 2005, 2 pages.
Chapter 1 Overview of the Origin Family Architecture from Origin and Onyx2 Theory of Operations Manual, published 1997, 18 pages.
Cisco MDS 9000 Family Multiprotocol Services Module, published 2006, 13 pages.
Comparing the I2C BUS to the SMBUS, Maxim Integrated, Dec. 1, 2000, p. 1.
Deering, "IP Multicast Extensions for 4.3BSD UNIX and related Systems," Jun. 1999, 5 pages.
Extended European Search Report for EP 10827330.1, mailed Jun. 5, 2013.
Final Office Action on U.S. Appl. No. 12/889,721, mailed Apr. 17, 2014.
Final Office Action on U.S. Appl. No. 12/794,996, mailed Jun. 19, 2013.
Final Office Action on U.S. Appl. No. 13/475,713, mailed Oct. 17, 2014.
Final Office Action on U.S. Appl. No. 13/475,722, mailed Oct. 20, 2014.
Final Office Action on U.S. Appl. No. 13/527,498, mailed Nov. 17, 2014.
Final Office Action on U.S. Appl. No. 13/624,725, mailed Nov. 13, 2013.
Final Office Action on U.S. Appl. No. 13/624,731, mailed Jul. 25, 2014.
Final Office Action on U.S. Appl. No. 13/705,340, mailed Aug. 2, 2013.
Final Office Action on U.S. Appl. No. 13/705,414, mailed Aug. 9, 2013.
Final Office Action on U.S. Appl. No. 13/624,731, mailed Nov. 12, 2013.
fpga4fun.com,"What is JTAG?", 2 pages, Jan. 31, 2010.
From AT to BTX: Motherboard Form Factor, Webopedia, Apr. 29, 2005, p. 1.
HP Virtual Connect Traffic Flow—Technology brief, Jan. 2012, 22 pages.
International Preliminary Report on Patentability for PCT/US2009/044200, mailed Nov. 17, 2010.
International Preliminary Report on Patentability for PCT/US2012/038986 issued on Nov. 26, 2013.
International Preliminary Report on Patentability issued on PCT/US12/62608, issued May 6, 2014.
International Search Report and Written Opinion for PCT/US12/38987, mailed Aug. 16, 2012.
International Search Report and Written Opinion for PCT/US12/62608, mailed Jan. 18, 2013.
International Search Report and Written Opinion for PCT/US2010/053227, mailed May 10, 2012.
International Search Report and Written Opinion on PCT/US09/44200, mailed Jul. 1, 2009.
International Search Report and Written Opinion on PCT/US2012/038986, mailed Mar. 14, 2013.
Jansen et al., "SATA-IO to Develop Specification for Mini Interface Connector" Press Release Sep. 21, 2009, Serial ATA3 pages.

(56) References Cited

OTHER PUBLICATIONS

Nawathe et al., "Implementation of an 8-Core, 64-Thread, Power Efficient SPARC Server on a Chip", IEEE Journal of Solid-State Circuits, vol. 43, No. 1, Jan. 2008, pp. 6-20.
Non-Final Action on U.S. Appl. No. 13/728,362, mailed Feb. 21, 2014.
Non-Final Office Action on U.S. Appl. No. 12/889,721, mailed Jul. 2, 2013.
Non-Final Office Action on U.S. Appl. No. 13/475,722, mailed Jan. 17, 2014.
Non-Final Office Action on U.S. Appl. No. 12/794,996, mailed Sep. 17, 2012.
Non-Final Office Action on U.S. Appl. No. 12/889,721, mailed Oct. 11, 2012.
Non-Final Office Action on U.S. Appl. No. 12/889,721, mailed Sep. 29, 2014.
Non-Final Office Action on U.S. Appl. No. 13/234,054, mailed Oct. 23, 2014.
Non-Final Office Action on U.S. Appl. No. 13/453,086, mailed Mar. 12, 2013.
Non-Final Office Action on U.S. Appl. No. 13/475,713, mailed Apr. 1, 2014.
Non-Final Office Action on U.S. Appl. No. 13/527,505, mailed May 8, 2014.
Non-Final Office Action on U.S. Appl. No. 13/527,498, Mailed May 8, 2014.
Non-Final Office Action on U.S. Appl. No. 13/624,725, mailed Jan. 10, 2013.
Non-final office action on U.S. Appl. No. 13/624,731 mailed Jan. 29, 2013.
Non-Final Office Action on U.S. Appl. No. 13/662,759, mailed Nov. 6, 2014.
Non-Final Office Action on U.S. Appl. No. 13/692,741, mailed Sep. 4, 2014.
Non-Final Office Action on U.S. Appl. No. 13/705,286, mailed May 13, 2013.
Non-Final Office Action on U.S. Appl. No. 13/705,340, mailed Mar. 12, 2014.
Non-Final Office Action on U.S. Appl. No. 13/705,340, mailed Mar. 29, 2013.
Non-Final Office Action on U.S. Appl. No. 13/705,414, mailed Apr. 9, 2013.
Non-Final Office Action on U.S. Appl. No. 13/705,428, mailed Jul. 10, 2013.
Notice of Allowance on U.S. Appl. No. 13/453,086, mailed Jul. 18, 2013.
Notice of Allowance on U.S. Appl. No. 13/705,414, mailed Nov. 4, 2013.
Venaas, "IPv4 Multicast Address Space Registry," 2013, http://www.iana.org/assignments/multicast-addresses/multicast-addresses.xhtml.
Final Office Action on U.S. Appl. No. 13/527,505, mailed Dec. 5, 2014.
Notice of Allowance on U.S. Appl. No. 13/705,340, mailed Dec. 3, 2014.
Hossain et al., "Extended Butterfly Fat Tree Interconnection (EFTI) Architecture for Network on Chip," 2005 IEEE Pacific Rim Conference on Communications, Computers and Signal Processing, Aug. 2005, pp. 613-616.
Final Office Action on U.S. Appl. No. 12/889,721, mailed May 22, 2015.
Final Office Action on U.S. Appl. No. 13/234,054, mailed Apr. 16, 2015.
Final Office Action on U.S. Appl. No. 14/334,931, mailed Jul. 9, 2015.
Non-Final Office Action on U.S. Appl. No. 13/234,054, mailed Aug. 6, 2015.
Non-Final Office Action on U.S. Appl. No. 13/624,725, mailed Apr. 23, 2015.
Non-Final Office Action on U.S. Appl. No. 13/692,741, mailed Jul. 1, 2015.
Non-Final Office Action on U.S. Appl. No. 13/728,308, mailed May 14, 2015.
Non-Final Office Action on U.S. Appl. No. 13/728,428, mailed Jun. 12, 2015.
Non-Final Office Action on U.S. Appl. No. 14/052,723, mailed May 1, 2015.
Office Action on Taiwan Application 101139729, mailed May 25, 2015 (English translation not available).
Final Office Action on U.S. Appl. No. 14/106,698, mailed Aug. 19, 2015.
Notice of Allowance U.S. Appl. No. 13/728,308, mailed Oct. 7, 2015.
Das et al., "Unifying Packet and Circuit Switched Networks," IEEE Globecom Workshops 2009, Nov. 30 2009, pp. 1-6.
Final Office Action on U.S. Appl. No. 13/624,725 mailed Mar. 10, 2016.
Final Office Action on U.S. Appl. No. 13/728,428 mailed May 6, 2016.
Non-Final Office Action on U.S. Appl. No. 14/725,543 mailed Apr. 7, 2016.
Notice of Allowance on U.S. Appl. No. 14/334,931 mailed May 20, 2016.
Notice of Allowance on U.S. Appl. No. 13/624,725, mailed Mar. 30, 2016.
Notice of Allowance on U.S. Appl. No. 13/662,759 mailed May 10, 2016.
Final Office Action on U.S. Appl. No. 13/234,054, mailed Jan. 26, 2016.
Final Office Action on U.S. Appl. No. 13/662,759, mailed Feb. 22, 2016.
Final Office Action on U.S. Appl. No. 14/052,723, mailed Dec. 3, 2015.
Non-Final Office Action on U.S. Appl. No. 14/334,178 mailed Dec. 18, 2015.
Non-Final Office Action on U.S. Appl. No. 12/889,721, mailed Feb. 24, 2016.
Non-Final Office Action on U.S. Appl. No. 14/334,931 Mailed Dec. 11, 2015.
Notice of Allowance on U.S. Appl. No. 13/692,741 mailed Dec. 4, 2015.
Notice of Allowance on U.S. Appl. No. 13/728,428 mailed Jul. 18, 2016.
Notice of Allowance on U.S. Appl. No. 14/334,178 mailed Jun. 8, 2016.
Non-Final Office Action on U.S. Appl. No. 13/234,054 mailed Oct. 20, 2016.
Non-Final Office Action on U.S. Appl. No. 14/753,948 mailed Nov. 4, 2016.

* cited by examiner

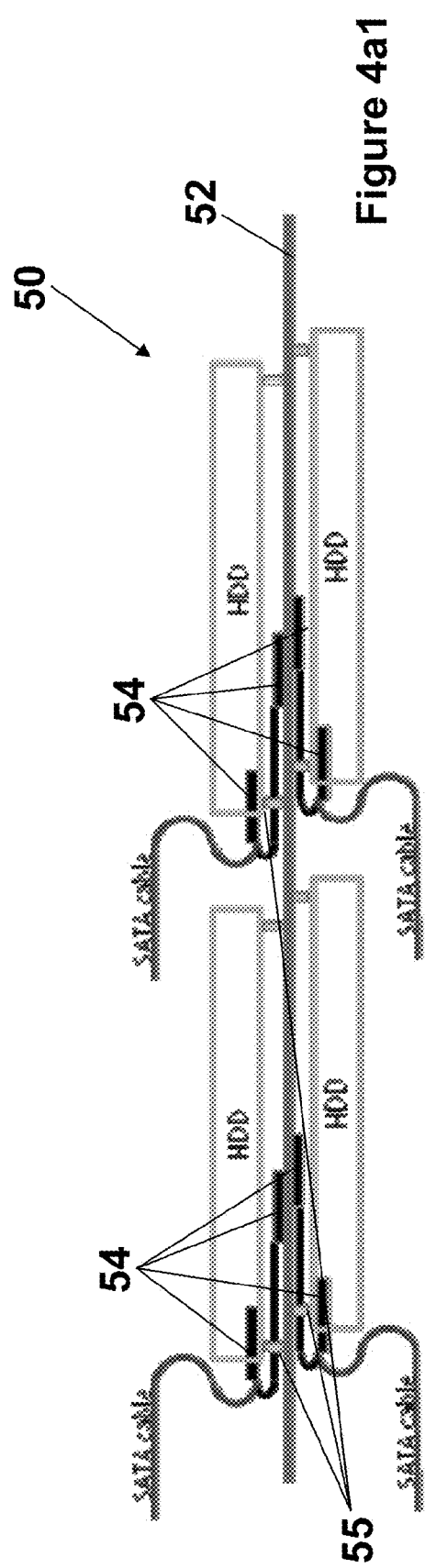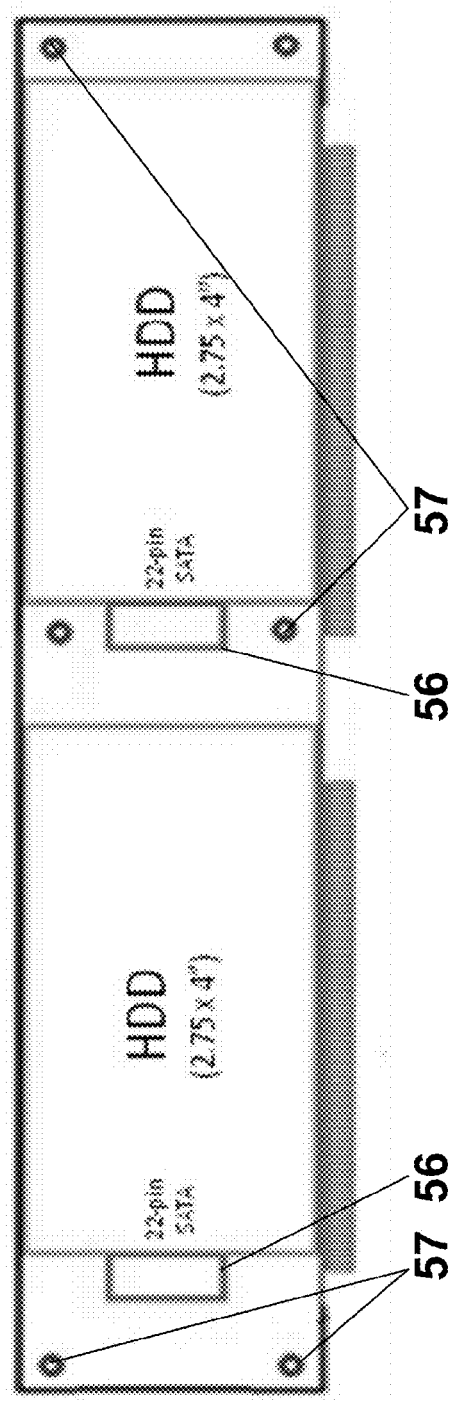
Figure 4a1
Figure 4a2

SYSTEM AND METHOD FOR FLEXIBLE STORAGE AND NETWORKING PROVISIONING IN LARGE SCALABLE PROCESSOR INSTALLATIONS

This application is a divisional application and claims the benefit of U.S. patent application Ser. No. 13/284,855 filed on Oct. 28, 2011, the disclosure of which is incorporated herein by reference.

FIELD

The disclosure relates generally to provisioning within a system design to allow the storage and networking resources to scale with compute resources.

BACKGROUND

Server systems generally provide a fixed number of options. For example, there are a fixed number of PCI Express IO slots and a fixed number of hard drive bays, which often are delivered empty as they provide future upgradability. The customer is expected to gauge future needs and select a server chassis category that will serve present and future needs. Historically, and particularly with x86-class servers, predicting the future needs has been achievable because product improvements from one generation to another have been incremental.

With the advent of scalable servers, the ability to predict future needs has become less obvious. For example, in the class of servers within a 2U chassis, it is possible to install 120 compute nodes in an incremental fashion. Using this server as a data storage device, the user may require only 4 compute nodes, but may desire 80 storage drives. Using the same server as a pure compute function focused on analytics, the user may require 120 compute nodes and no storage drives. The nature of scalable servers lends itself to much more diverse applications which require diverse system configurations. As the diversity increases over time, the ability to predict the system features that must scale becomes increasingly difficult.

An example of a typical server system is shown in FIG. 1. The traditional server system has fixed areas for 24 hard drives along its front surface and a fixed area for compute subsystem (also called motherboard) and a fixed area for IO expansion (PCI slots). This typical server system does not provide scalability of the various computer components. Thus, it is desirable to create a system and method to scale storage and networking within a server system and it is to this end that this disclosure is directed. The benefit of this scalability is a much more flexible physical system that fits many user applications.

BRIEF DESCRIPTION OF THE DRAWINGS

FIG. 4$b$ illustrates an exemplary storage module which implements SATA SSD modules.

FIG. 4$c$ illustrates an exemplary storage module which implements mSATA SSD modules.

FIG. 8$b$ illustrates an example of how the exemplary system can be populated with a 1:1 ratio of mix of compute and storage. These are useful, for example, for Hadoop applications.

FIG. 8$c$ illustrates another example of how the exemplary system can be populated specifically for storage applications.

FIG. 8$d$ illustrates an example of a straddle slot. For long chassis', a practical limit is reached on system board size. The center columns of slots straddle across system boards.

FIG. 8$e$ illustrates the use of straddle slots in systems with a much larger system board area.

DETAILED DESCRIPTION OF ONE OR MORE EMBODIMENTS

The disclosure is particular applicable to a 2U chassis which is the most widely favored form factor for PC-class servers. The concepts herein apply to any chassis form factor, such as tower and rack chassis' of varying customary sizes and any unconventional form. For example, FIG. 8$e$ shows an unconventional form factor, the sliding door, which relies on rack rails at the top and bottom of a server rack, rather than left and right sides as used by conventional rack chassis'. The sliding door approach expands the usable space for system boards, but at the same time, it creates a new interconnect problem between system boards that should be solved by the flexible provisioning concepts herein.

Computer architecture have various components and those components can be categorized in three categories: compute, storage, and IO wherein the compute category may include computing related or processor components, the storage category are storage type devices and IO are input/output components of the computer architecture. Each category can be further subdivided, and each category can be defined to contain certain element types. For example, compute can be subdivided into an ALU, cache, system memory, and local peripherals. Also for example, the storage category can contain element types of hard drives, solid state storage devices, various industry-standard form factors, or non-standard devices. For this disclosure, the component level (compute, storage, IO) are used with the understanding that each component has dimensions and attributes to which the same concepts may be applied.

The system and method of the disclosure allow the same physical space to be used by any of the computer components: compute devices, storage devices, or IO devices. This provides the greatest flexibility in configuration of systems for different applications. In addition, devices within the computer system that support all three components, such as power supplies and fans, will be assumed to be stationary for simplicity in the examples provided. It is understood that these support devices do not have to be stationary, depending on the goals in differentiation of the system design, meaning that they also can scale as needed.

Figure 2:
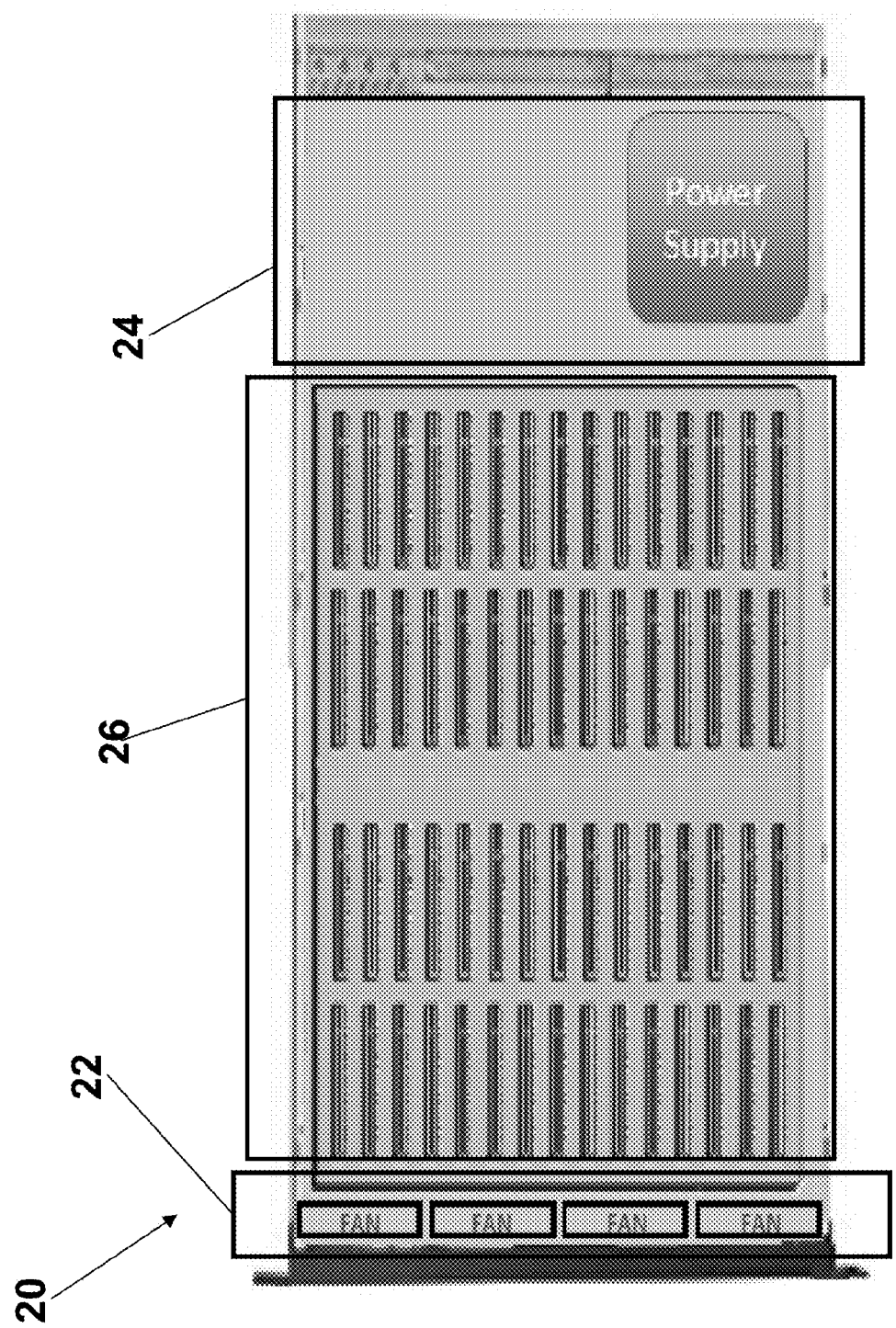
FIG. 2 illustrates an exemplary system with multiple slots that can house a compute module, a storage module, or an IO module.
Figure 3:
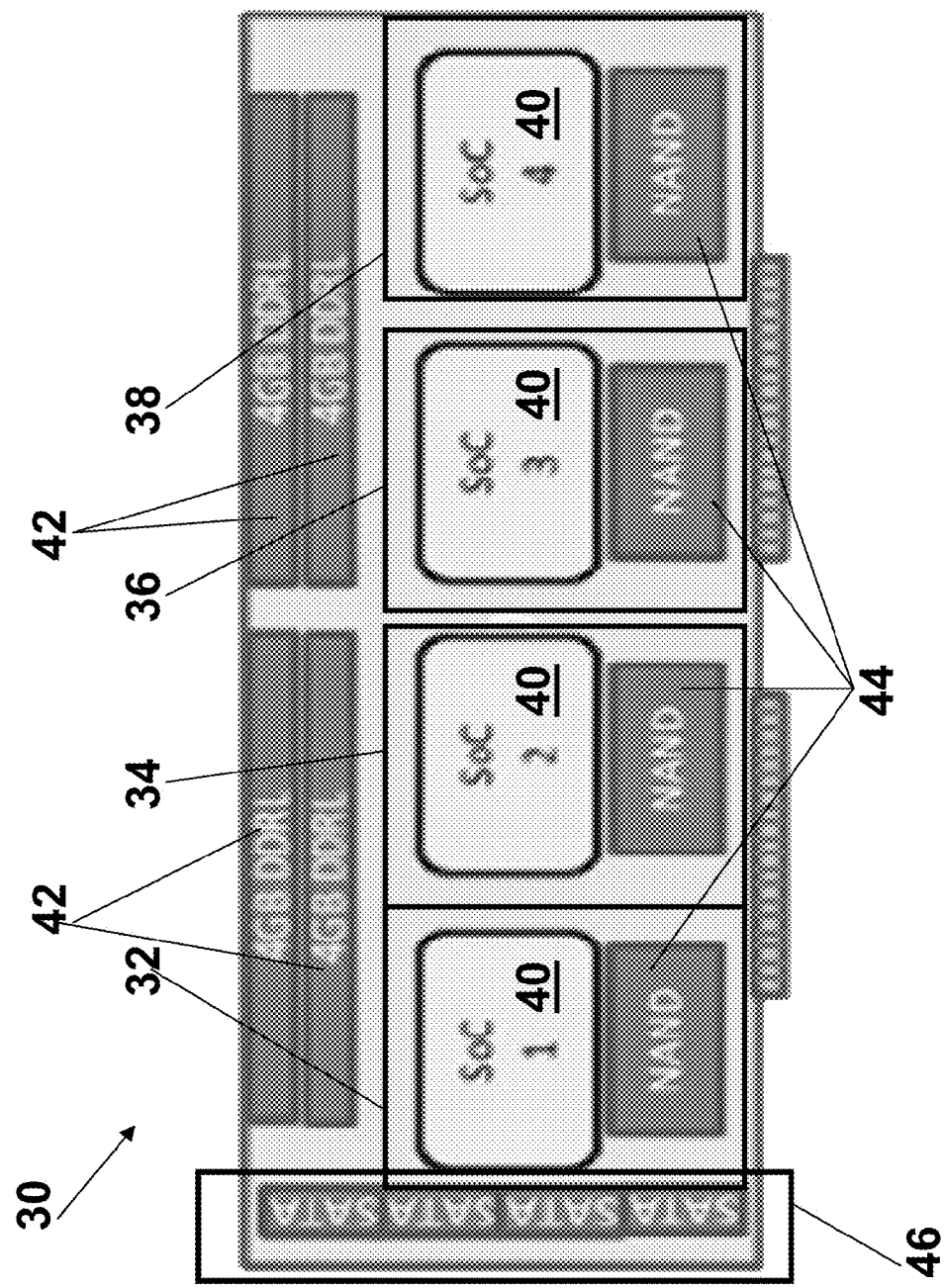
FIG. 3 illustrates an exemplary compute module.

In this example, a "slot" consists of physical connectors and a defined volume of space above these connectors. In one implementation, two PCI Express x16 connectors are used, along with a volume of 10" length by 2.7" height by 1" width. This volume is selected based on associated component heights, the restrictions of a 2U chassis, and a length driven by the PCB space required to accommodate this implementation. It is understood that other connector types can be used, depending on the signaling frequency and quantity of pins required. It is understood that other volumes can be used, depending on the physical constraints that are acceptable for the application. The connector pin definitions are critical to accommodate the many needs of the computer components, both in power delivery and bandwidth of the electrical interfaces. FIG. 2 depicts the resulting example system 20 that has one or more fixed locations 22 in the system for fans, one or more fixed locations 24 for the power supplies, and one or more slots 26 (30 slots in this example) for processors, storage or IO components of the system in which An exemplary compute module 30 is shown in FIG. 3. In support of the principle of scaling, the compute module 30 has one or more nodes, such as four nodes 32-38 in this example. Each node consists of a highly integrated SOC (System On Chip) 40, associated DIMM 42 for system memory, nonvolatile memory (NAND) 44 for local storage space, one or more known SATA channels 46 for connectivity to storage components and other necessary small devices which are necessary for general functions of the node (EEPROMs, boot flash memory, sensors, etc). The four nodes 32-38 have local IO connections to each other, which provide intercommunication and redundancy if an external IO connection fails. Each of the nodes runs an independent operating system, although as another example, a cache-coherent compute module is possible which would run one instance of an operating system on each node.

Figure 1:
FIG. 1 illustrates a traditional server system, depicting fixed areas for 24 hard drives along its front surface and a fixed area for compute subsystem (also called motherboard) and a fixed area for IO expansion (PCI slots).
Figure 4B:
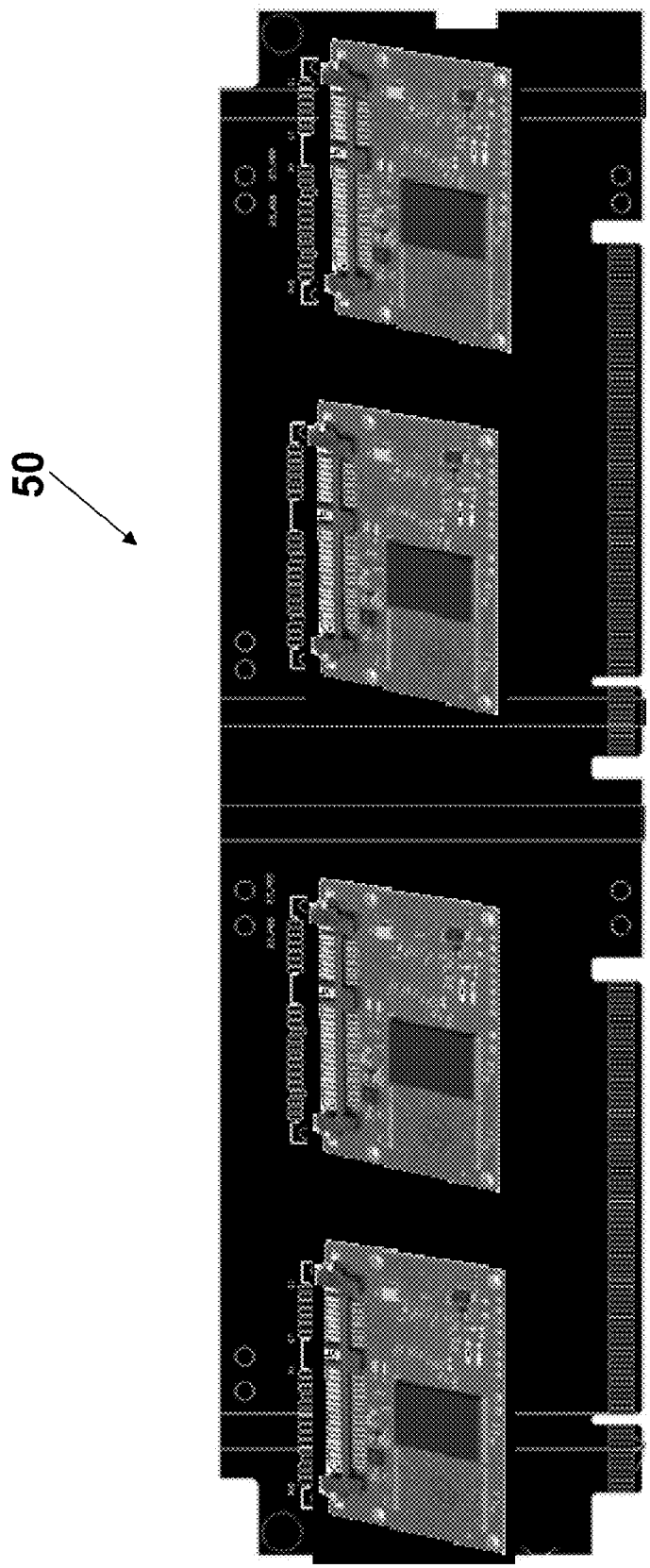
FIGS. 4$a$1 and 4$a$2 are a side view and a top view, respectively, of an exemplary storage module which implements industry standard 2.5" hard drives or SSDs (solid state drives).
Figure 4C:
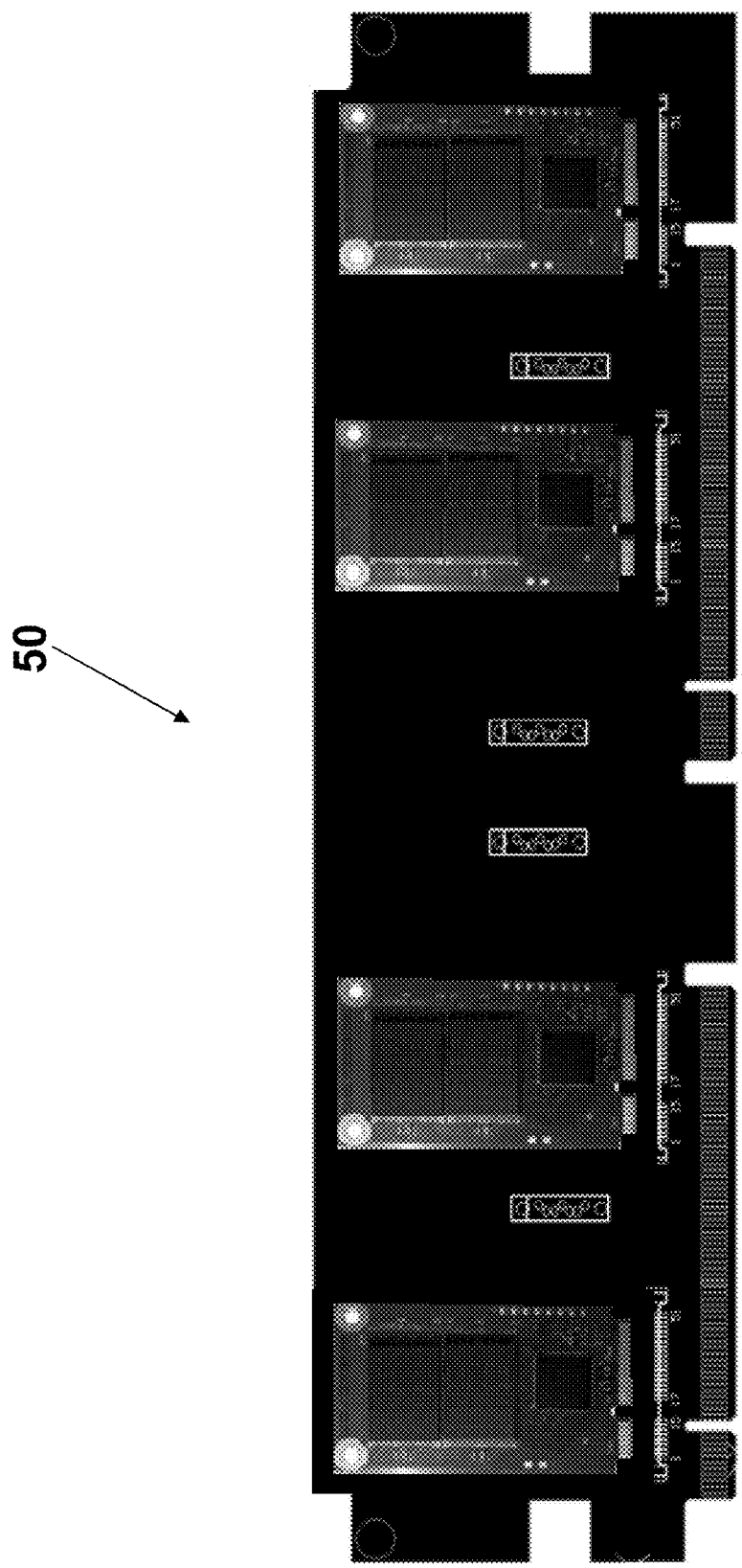

Examples of storage modules 50 that may be used in the system are shown in FIGS. 4a, 4b, and 4c. FIGS. 4a1 and 4a2 illustrate a storage module that leverages the existing industry-standard 2.5" drive form factor for hard drives (defined to contain spinning mechanical platters which store data) or for solid state drives (defined to have no moving parts and uses integrated circuits for its storage media). In this example, it is possible to use a printed circuit board (PCB) card edge connector for power delivery and/or data delivery using the necessary IO standard, such as SATA or SAS. The IO standard selected is purely a convenience based on support by the implemented devices. Any IO protocol can be routed through this card edge connector as long as the mechanical interface can support the necessary signaling frequency. Alternatively, directly connecting the IO for data delivery to the drive provides further flexibility in system configuration.

In FIG. 4a1, a printed circuit board 52 is shown to which power/data connectors and voltage regulators are integrated for connection to subsequently attached storage devices. The storage modules also have one or more connectors 54, such as SATA power connectors, and power cables to connect power from PCB power rails to the attached storage media (in this case, SATA 2.5" mechanical spindle hard drives). In this example, these cables are not needed for SATA SSD nor mSATA. The storage module may also have stand-offs 55 that mount the 2.5" SATA HDD to the blue mounting holes in 4a2. The storage module also has the SATA data cable 56 which do not convey power.

In FIG. 4a2, the storage module has a set of SATA power/data connector 56 that are another method of attaching a hard drive to the PCB. The storage module in FIG. 4s2 may also have one or more mounting holes 57 for the standoffs 55 shown in FIG. 4a1. They also include holes used for standard manufacturing of the PCB assembly.

FIG. 4b depicts a storage module that implements an industry-standard 22-pin SATA connector and interface, along with mechanical support features, to support SATA SSD modules per the JEDEC MO-297 standard. FIG. 4c depicts a storage module that implements an industry-standard x1 PCI connector, along with mechanical support features to support the mSATA modules per the JEDEC MO-300 standard.

The example in FIG. 4c demonstrates an opportunity to expand beyond the industry standard to maximize the benefit of a storage module that can be very close to its associated compute module. The reuse of an x1 PCI connector for the mSATA module left many pins unused, as the JEDEC standard had need for only one SATA channel through this interface. In fact, there is space for 5 additional SATA channels, even when allocating pins for sufficient grounding. This allows up to 6 SATA channels, each with smaller memories, as opposed to one SATA channel with one large memory block, although both scenario's can result in the same total storage space. The advantage of the multiple SATA channels is increased interface bandwidth, created by the possibility of parallel access to memory. Given that the operating system can stripe across multiple physical disks to create a single logical disk, the net change is a boost in SATA interface performance. Thus, mSATA modules with greater than one SATA channel can provide a new solution to IO bottlenecks to disks.

Figure 5:
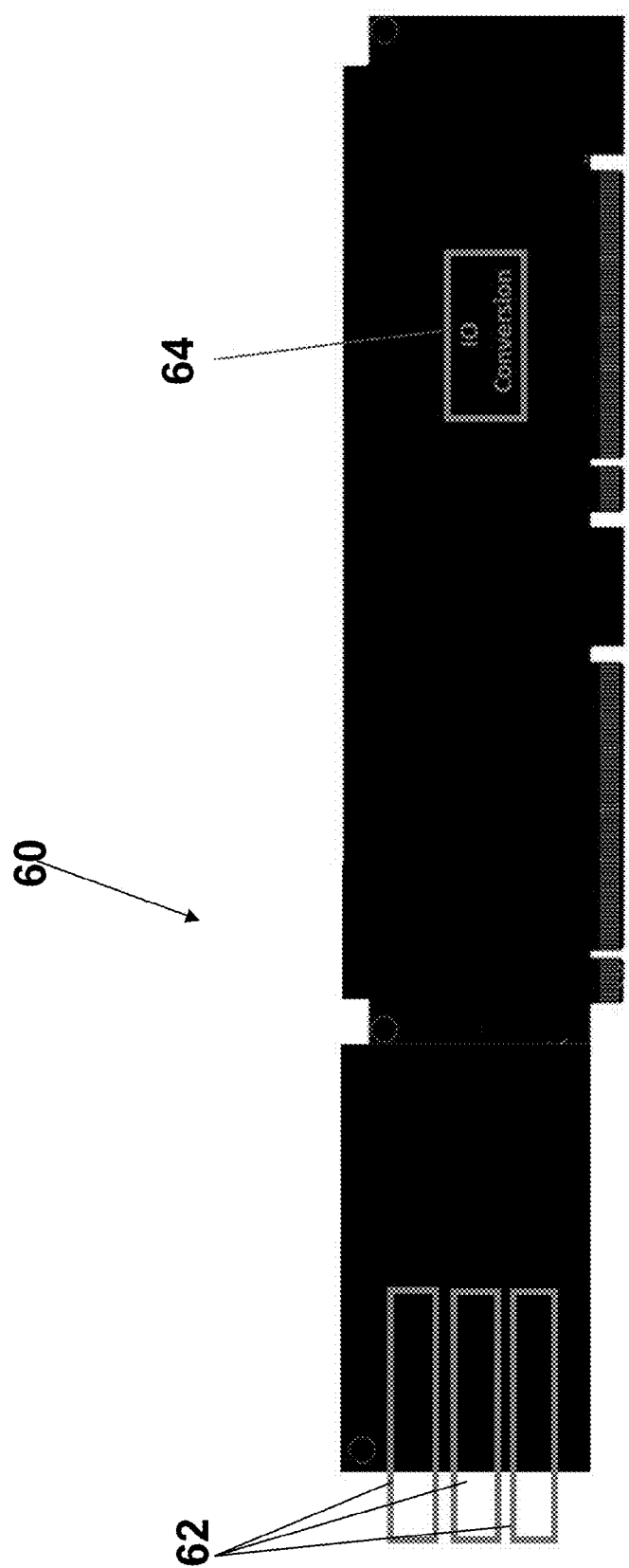
FIG. 5 illustrates an exemplary IO module.

An exemplary IO module 60 for the system is shown in FIG. 5. Unlike a Network Interface Controller (NIC) that would plug into a conventional server and tie into its operating system, this IO module 60 connects to the infrastructural IO of the system at its edge connectors 62 and provides a translation 64 (using an IO translation circuit) from the internal IO protocol to an external IO protocol, such as Ethernet. The IO module 60 operates independent of any particular operating system of any node. The IO module 60 can support one or many external IO ports, and can take on a form factor that is suitable for a particular chassis design. The benefit of modularity allows the quantity of IO modules to be determined by the bandwidth requirement for data traversing from this system to/from others.

Figure 6:
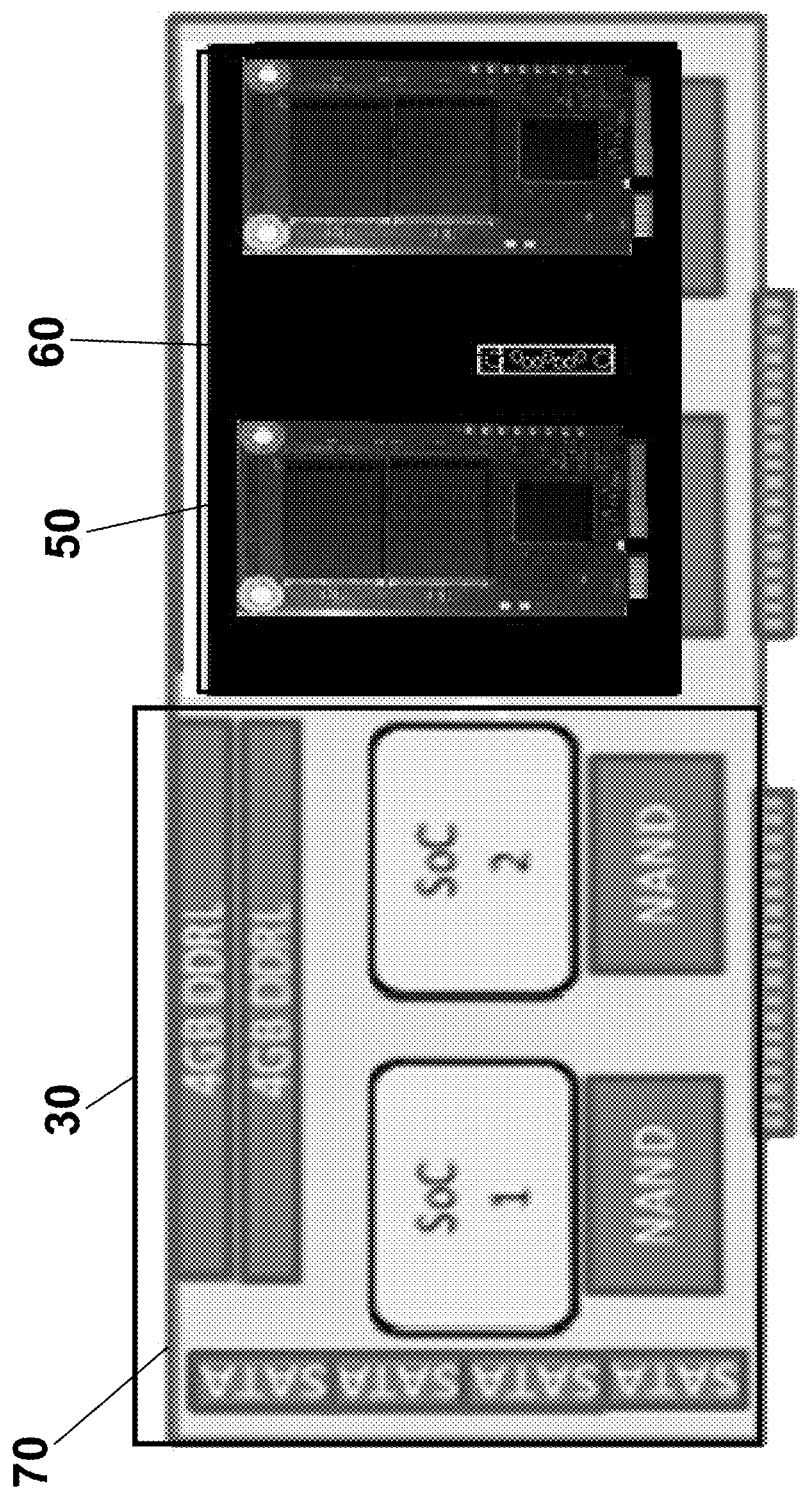
FIG. 6 illustrates an exemplary hybrid module.

An exemplary hybrid module 70 is shown in FIG. 6, demonstrating that a combination of compute 30, storage 50, and IO 60 concepts can be implemented on a single module that are then incorporated into the system.

Figure 7:
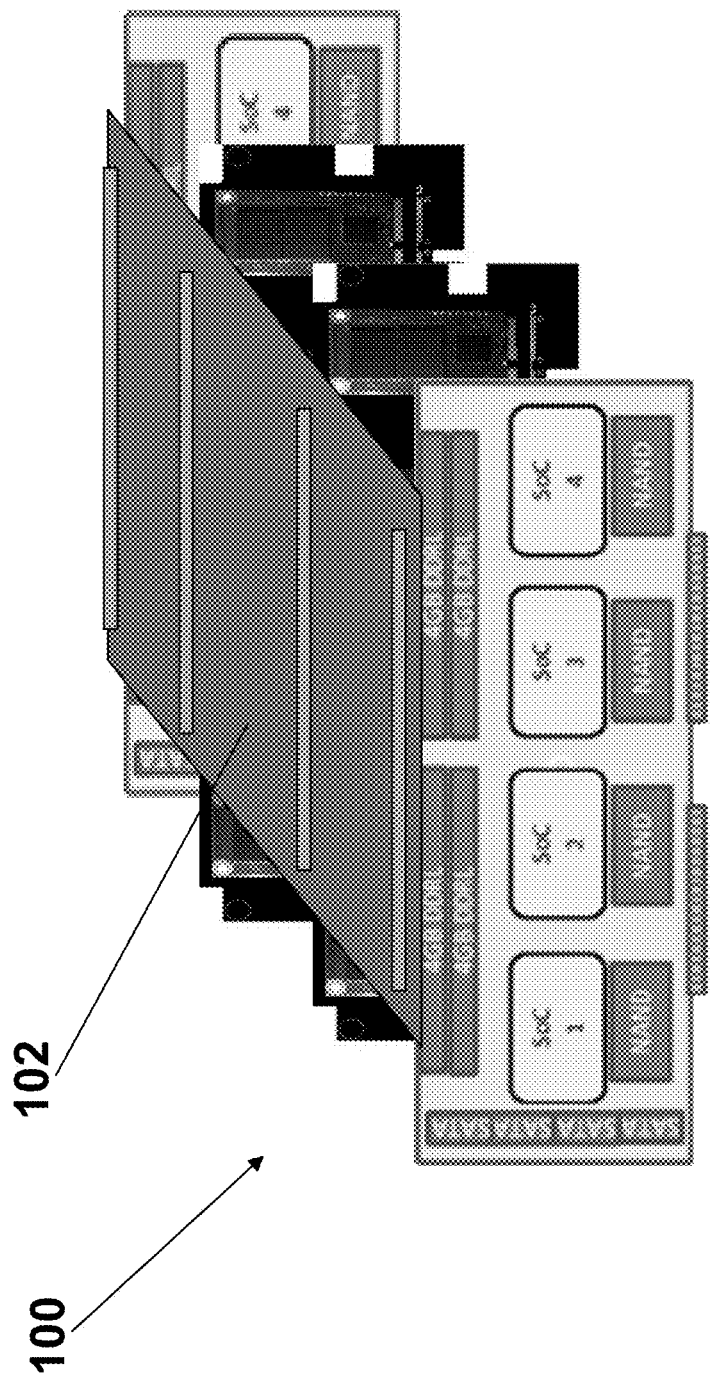
FIG. 7 illustrates a module block (or super module) made up of an integrated collection of modules connected together by way of a private interconnect.

FIG. 7 illustrates a module block (or super module) 100 made up of an integrated collection of modules 70 connected together by way of a private interconnect 102.

Figure 8A:
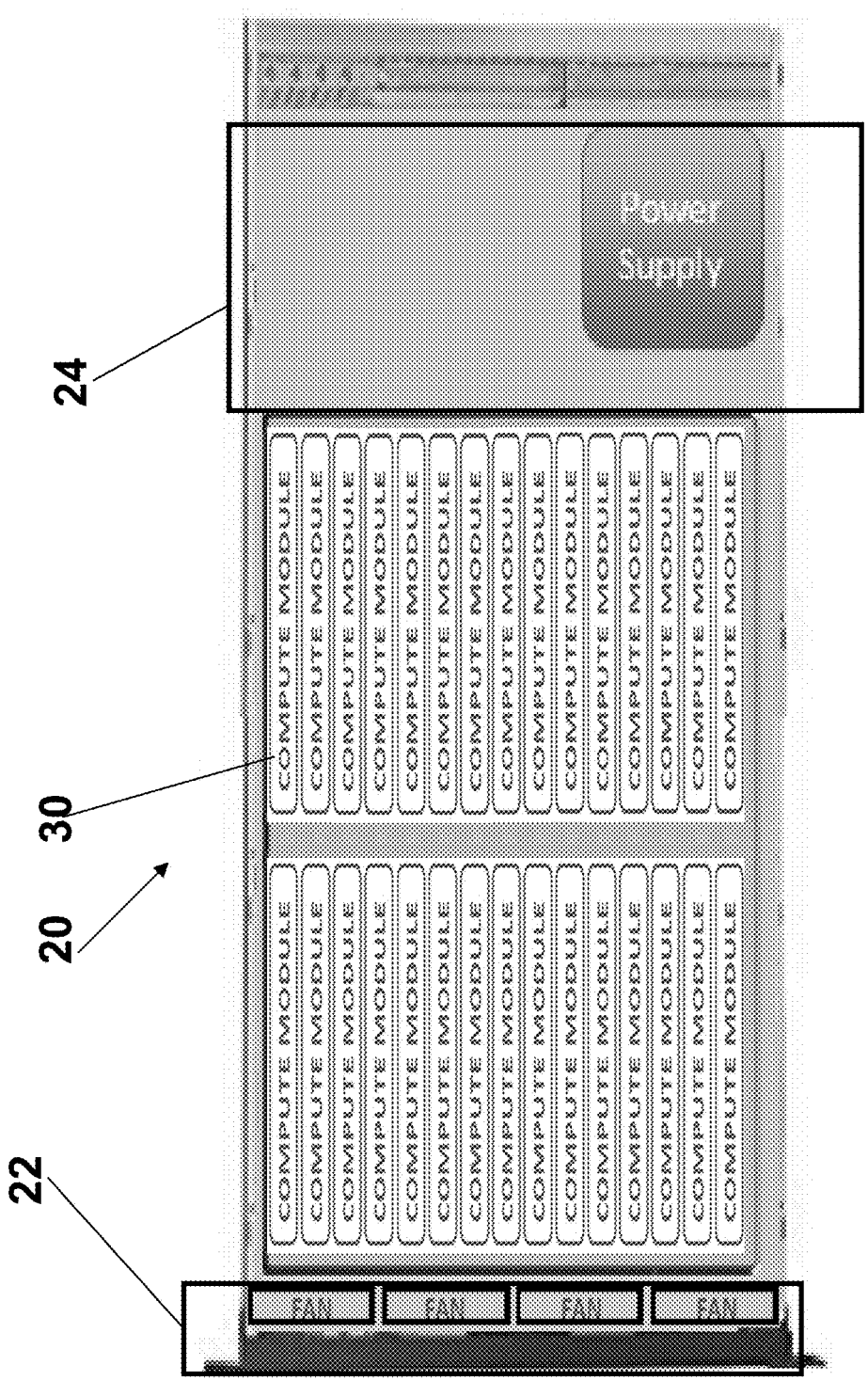
FIG. 8$a$ illustrates an example of how the exemplary system can be populated specifically for high compute applications which require no local storage.
Figure 8B:
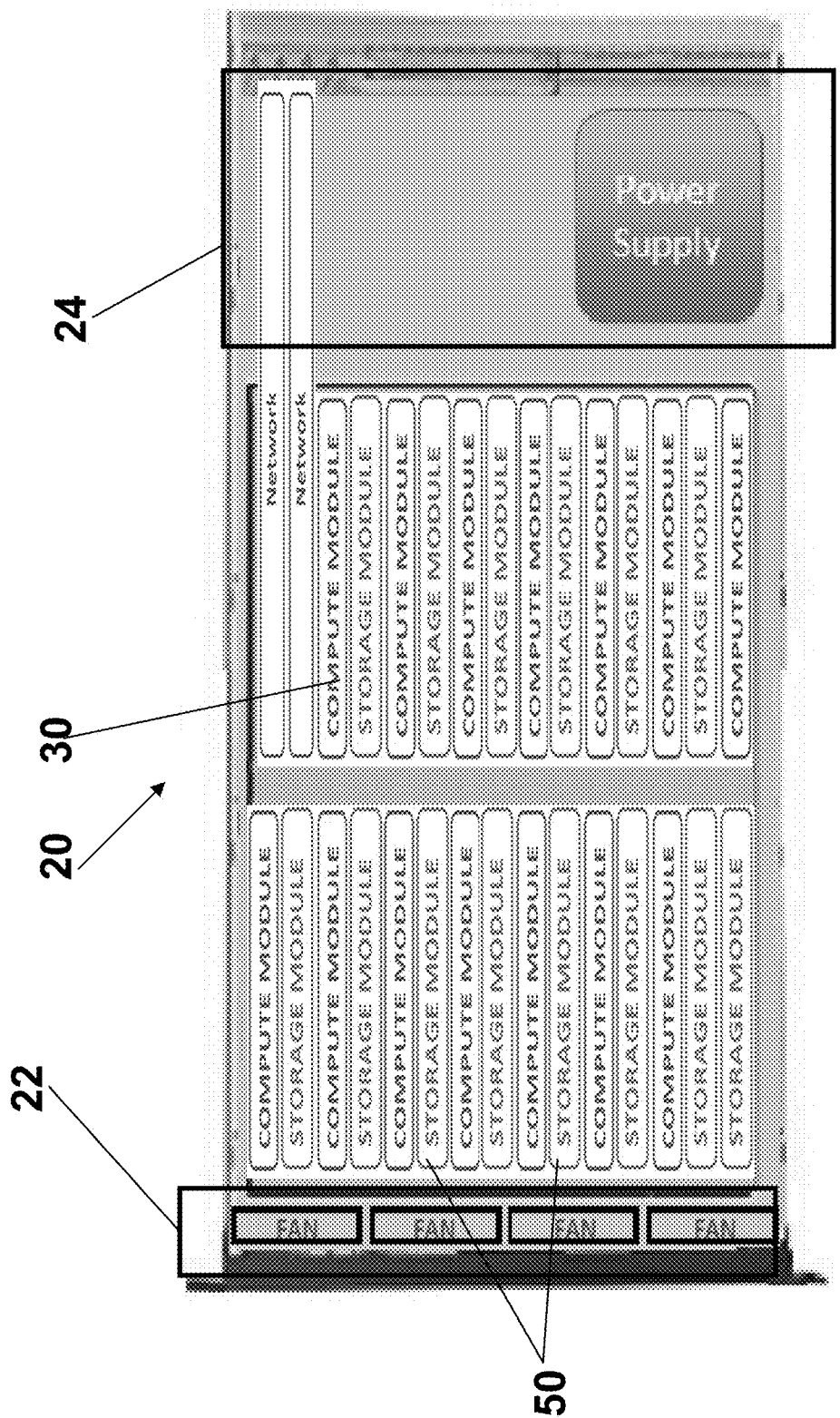
Figure 8C:
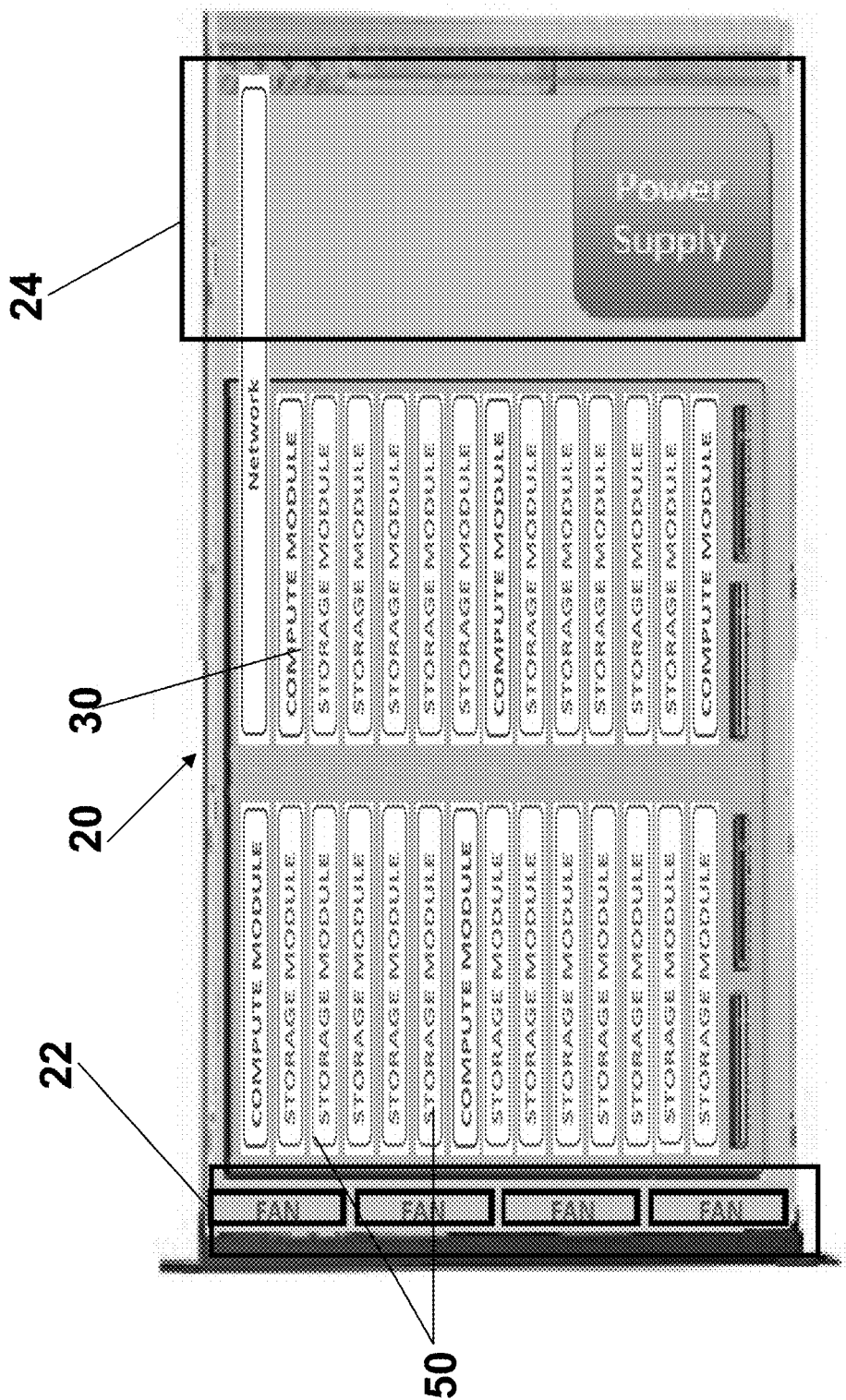

With the compute, storage, and IO module concepts described above, exemplary systems of FIG. 8 are now described. FIGS. 8a, 8b, and 8c depict different system configurations to address the basic categories of compute-intensive applications, Hadoop applications, and storage applications respectively. Of course, many other combinations of modules are possible to form the recipe needed for specific applications. As shown, the module form factor is kept consistent for convenience, but when required, it can change also, as shown by the IO module labeled "Network". These degrees of flexibility allow creation of a family of modules that can be mixed and matched according to software application needs, with very little volume within the chassis tied to dedicated purposes. For example, FIG. 8a shows a system 20 that has the fans 22 and power supplies 24 and a plurality of compute modules 30 for a compute intensive system. In FIG. 8b, the system 20 has the same form factor and the fans and power supplies, but the slots 26 are filled with a combination of compute modules 20 and storage modules 50 as shown for a system that requires more storage than the system in FIG. 8a. FIG. 8c illustrates a system 20 has the same form factor and the fans and power supplies, but the slots 26 are filled a few compute modules 20 and many more storage modules 50 as shown for a system that requires more storage than computing power than the systems in FIGS. 8a and 8b.

Figure 8D:
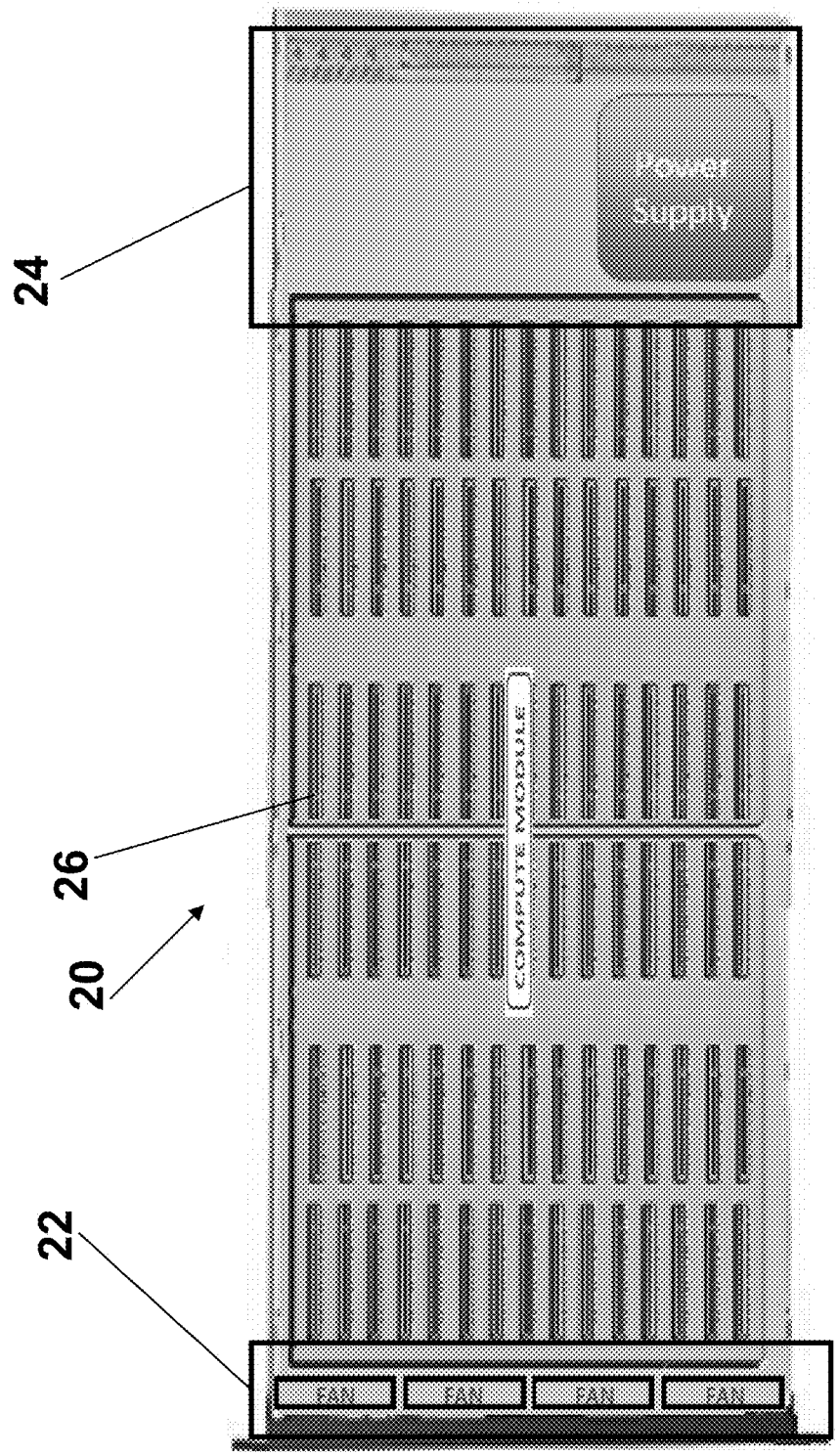

FIG. 8d expands on the system 20 concepts by considering a chassis that is particularly long, such that the system board size is larger than the practical limit allowed by PCB fabrication factories. Typical PCB panel sizes are 18"×24" or 24"×24", although panels up to 30" are also available with limited sources. Given a typical 2U chassis that fits in a 19" wide rack, the 18"×24" PCB panel is the preferred size for most server motherboards today. To expand beyond the 24" limit, board-to-board connectors must be used to interconnect two assemblies. When high speed signaling must pass between the two assemblies, a relatively expensive interconnect solution must be implemented, such as FCI AirMax connectors. The use of these connectors complicates the electrical design by adding signal integrity considerations and complicates the mechanical design due to the volume required for these connectors. Alternatively, the two system boards do not need to be directly connected at all, relying instead on the IO fabric within a Compute module to traverse data between them, called a "straddle slot". In FIG. 8d, the left system board might be aligned based on controlled mounting points, while the right system board might be designed to "float" on its mounting points such that installed modules can control the alignment of associated edge connectors.

Figure 8E:
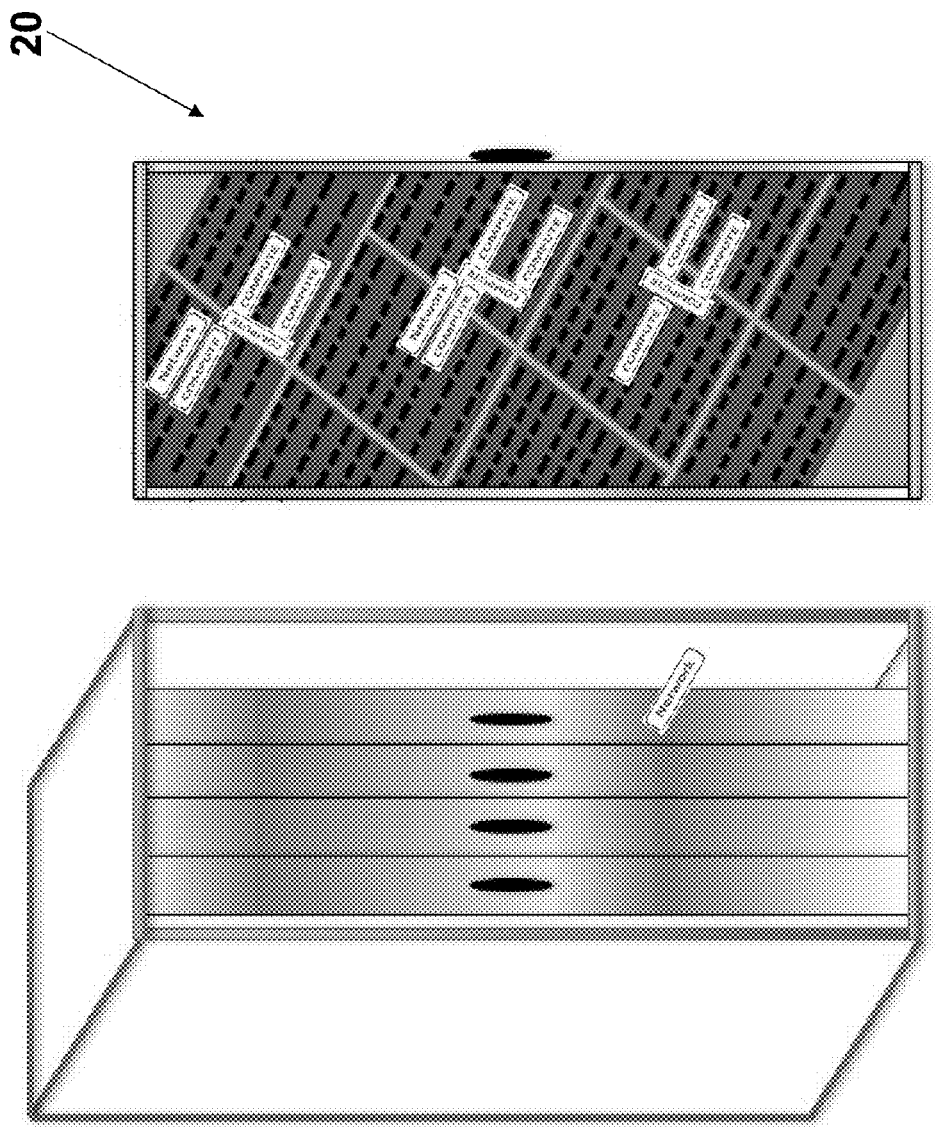

FIG. 8e breaks away from the 2U chassis example with an exemplary vertical system 20 that greatly expands the area possible for system boards. Each section on rails is referred to as a "vertical chassis". The black dashed lines represent module slots. Note the angled slot orientation enhances air flow due to natural convection, without the consequence of undue heat build-up caused in true vertical chimney rack designs. The straddle slot concept can be employed here to avoid the expense and space requirements of board-to-board high speed connectors. Power and cooling are not shown, as it is self-evident that space in the enclosure can be dedicated to these as needed.

While the foregoing has been with reference to a particular embodiment of the invention, it will be appreciated by those skilled in the art that changes in this embodiment may be made without departing from the principles and spirit of the disclosure, the scope of which is defined by the appended claims.

The invention claimed is:

1. A method for building a scalable system, the method comprising:
providing a chassis having a predetermined physical form factor, wherein the chassis has a plurality of slots into which modules are placed;
providing compute modules, storage modules, and input/output (I/O) modules, all of which are housed within the plurality of slots; and
determining one or more of the compute modules, one or more of the storage modules, and one or more of the I/O modules to form the scalable system based on a desired computing power, a desired storage power, and a desired input/output power for the scalable system, wherein a quantity of the one or more I/O modules is determined based, at least in part, on a bandwidth requirement for data traversing from and to the scalable system.

2. The method of claim 1, further comprising providing one or more support devices within the chassis that support the one or more compute modules, the one or more storage modules, and the one or more I/O modules housed within the chassis.

3. The method of claim 2, wherein the one or more support devices comprise a fan or a power supply.

4. The method of claim 1, wherein the plurality of slots each comprise a set of physical connectors and a volume of space.

5. The method of claim 4, wherein the set of physical connectors comprises one or more peripheral component interconnect express (PCIe) connectors.

6. The method of claim 5, wherein the set of physical connectors comprises two PCI Express x16 connectors, and wherein the volume of space is 10 inches in length by 2.7 inches in height by 1 inch in width.

7. The method of claim 1, wherein the chassis is a 2U chassis or a vertical chassis.

8. The method of claim 1, wherein each compute module further comprises one or more compute nodes.

9. The method of claim 8, wherein each compute node has a system on chip, a set of system memory that is accessible by the system on chip, and a local storage space for the system on chip.

10. The method of claim 1, wherein each storage module comprises a 2.5 inch cased serial advanced technology attachment (SATA) drive, a caseless SATA solid state device (SSD), or a Modular SATA (mSATA) SSD.

11. The method of claim 1, wherein each I/O module comprises a set of connectors and a translation circuit that translates between I/O protocols.

12. The method of claim 1, further comprising providing hybrid modules that are capable of being housed within the plurality of slots, wherein each hybrid module incorporates compute, storage, and I/O functions therein.

13. The method of claim 11, wherein the I/O protocols comprise an internal I/O protocol and an external I/O protocol.

14. The method of claim 1, wherein the scalable system is configured to address Hadoop applications.

15. The method of claim 1, further comprising providing one or more system boards within the chassis.

16. The method of claim 15, wherein the one or more system boards are interconnected by board-to-board connectors.

17. The method of claim 15, wherein the one or more system boards use the one or more compute modules to exchange data.

* * * * *